United States Patent
Zheng et al.

(10) Patent No.: US 7,800,287 B2
(45) Date of Patent: Sep. 21, 2010

(54) ENHANCED EMISSION FROM PC-LEDS USING IF FILTERS

(75) Inventors: Yi Zheng, Reading, MA (US); Bruce Bateman, Richmond, KY (US); Matthew A. Stough, Exeter, NH (US); Madis Raukas, Charlestown, MA (US)

(73) Assignee: Osram Sylvania Inc., Danvers, MA (US)

( * ) Notice: Subject to any disclaimer, the term of this patent is extended or adjusted under 35 U.S.C. 154(b) by 563 days.

(21) Appl. No.: 11/844,713

(22) Filed: Aug. 24, 2007

(65) Prior Publication Data

US 2008/0054803 A1    Mar. 6, 2008

Related U.S. Application Data

(60) Provisional application No. 60/823,771, filed on Aug. 29, 2006, provisional application No. 60/823,772, filed on Aug. 29, 2006.

(51) Int. Cl.
H01J 5/16 (2006.01)
H01J 63/04 (2006.01)
F21V 9/00 (2006.01)

(52) U.S. Cl. .................. 313/112; 362/293; 313/502

(58) Field of Classification Search ......... 313/484–487, 313/489, 498, 501–503, 512, 467, 468, 499; 362/235, 227, 231, 293, 545, 555, 800
See application file for complete search history.

(56) References Cited

U.S. PATENT DOCUMENTS

| 4,882,617 | A | 11/1989 | Vriens |
| 5,813,752 | A | 9/1998 | Singer et al. |
| 5,813,753 | A | 9/1998 | Vriens et al. |
| 6,155,699 | A * | 12/2000 | Miller et al. ............... 313/502 |
| 6,630,691 | B1 | 10/2003 | Mueller-Mach et al. |
| 7,210,977 | B2 * | 5/2007 | Ouderkirk et al. .......... 313/112 |
| 7,378,792 | B2 * | 5/2008 | Huang et al. ............... 313/512 |
| 2004/0145288 | A1 * | 7/2004 | Ouderkirk et al. .......... 313/512 |
| 2004/0145308 | A1 | 7/2004 | Rossner et al. |
| 2005/0269582 | A1 | 12/2005 | Mueller et al. |
| 2006/0202105 | A1 | 9/2006 | Krames et al. |
| 2009/0189512 | A1 * | 7/2009 | Miyaguchi et al. .......... 313/501 |

FOREIGN PATENT DOCUMENTS

EP           1491921 A1    12/2004
WO    WO 2006/087651 A2    8/2006

OTHER PUBLICATIONS

Luo et al, Analysis of high-power packages for phosphor-based white-light-emitting diodes, Appl. Phys. Lett. 86, 243505-1-243505-3 (2005).

Kim et al., Strongly Enhanced Phosphor Efficiency in GaInN White Light-Emitting Diodes Using Remote Phosphor Configuration and Diffuse Reflector Cup, Jpn. J. Appl. Phys., vol. 44, No. 21 L649-L651 (2005).

(Continued)

*Primary Examiner*—Peter Macchiarolo
(74) *Attorney, Agent, or Firm*—Robert F. Clark

(57) ABSTRACT

White-light efficiency from a light emitting diode is enhanced by recycling inwardly penetrating light outwardly by application of a multi-layer, thin film filter between the LED die and the phosphor layer. This procedure increases the package extraction efficiency.

13 Claims, 3 Drawing Sheets

OTHER PUBLICATIONS

Narendran, Improved Performance White LED, Fifth International Conference on Solid State Lighting, Proc. of SPIE vol. 5941 594108-1-594108-6 (2005).

Narendran et al., Extracting phosphor-scattered photons to improve white LED efficiency, Phys. Stat. Sol. (a), 202, No. 6, R60-R62 (2005).

* cited by examiner

ENHANCED EMISSION FROM PC-LEDS USING IF FILTERS

CROSS REFERENCE TO RELATED APPLICATIONS

This application claims priority from Provisional Patent Application Nos. 60/823,771 and 60/823,772, both of which were filed on Aug. 29, 2006, and are hereby incorporated herein by reference.

TECHNICAL FIELD

This application relates to light sources and particularly to solid-state light sources such as light emitting diodes. More particularly, it relates to enhanced emission from such light sources. Still more particularly, it relates to enhanced emission from phosphor-converting LED light sources (pcLED or pcLEDs). Such constructions are often employed to provide white light.

BACKGROUND ART

White light emitting LEDs generally are comprised of a blue emitting LED combined with a phosphor that is stimulated by the blue (or ultraviolet) emission of the LED into emitting yellow light, the combination of the yellow and blue emissions providing a white light. Generally, the phosphor is $Y_3Al_5O_{12}:Ce^{3+}$, (hereafter, YAG:Ce). Because of various light scattering effects, some of the light generated is not available. If more of the light generated were to be emitted in a forward direction, that is, in the direction of the field to be illuminated, it would be advantageous.

DISCLOSURE OF INVENTION

It is, therefore, an object of the invention to obviate the disadvantages of the prior art.

It is another object of the invention to enhance the operation of white emitting pcLEDs.

These objects are accomplished, in one aspect of the invention, by the provision of a white light emitting diode comprised of a light-emitting die; an interference filter overlying the die, and a phosphor layer overlying the interference filter. Light emitted by the light-emitting die passes through the interference filter and activates the phosphor, which light is reflected outwardly with the remaining light from the die thus providing the white light. The reflecting interference filter greatly enhances the light output from the device, since previous light loss caused by scattered light rays being reflected rearwardly, that is, away from the direction to be illuminated, is eliminated as those rays are reflected forwardly.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

Figure 1:
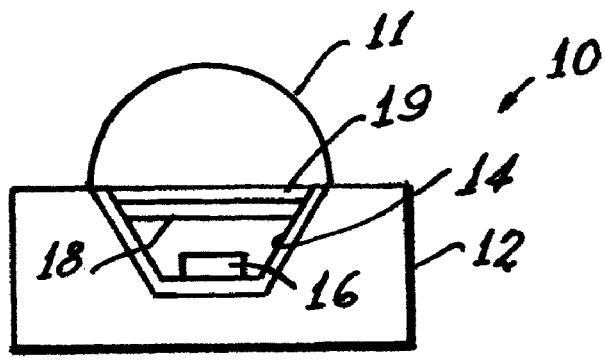
FIG. 1 is a diagrammatic view of an embodiment of the invention.

Referring now to the drawings with greater particularity, there is shown in FIG. 1 a light emitting device 10 having a cup-shaped housing 12 that can have a reflecting coating 14 applied to the interior wall thereof. A die 16 that emits light of a first frequency is positioned at the bottom of the cup-shaped housing. An optical filter 18 closes the opening of the cup and is attached to the underside, that is, the side facing the die, of a transparent, monolithic ceramic phosphor 19 that will emit light of a second frequency when energized by light of the first frequency. Generally, the light of the first frequency will be in the blue region of the spectrum and the light of the second frequency will be in the yellow region of the spectrum, the blending of the frequencies providing white light. An optical element 11 is typically used to shape the light distribution from the pcLED.

The optical filter 18 is preferably comprised of multiple layers of suitable materials, such, for example, as alternate layers of niobium oxide ($Nb_2O_5$) and silicon dioxide ($SiO_2$).

A preferred form of the optical filter 18 is shown in Table 1. Preferably, the filter has a reflectance of less than about 15% at wavelengths from about 350 nm to about 480 nm and a reflectance of greater than about 80% at wavelengths from about 510 nm to about 700 nm.

TABLE 1

16-layer thin film filter design

| Layer | Material | Thickness (nm) |
|---|---|---|
| 1 | $Nb_2O_5$ | 69.94 |
| 2 | $SiO_2$ | 106.99 |
| 3 | $Nb_2O_5$ | 59.34 |
| 4 | $SiO_2$ | 124.57 |
| 5 | $Nb_2O_5$ | 27.16 |
| 6 | $SiO_2$ | 125.14 |
| 7 | $Nb_2O_5$ | 57.10 |
| 8 | $SiO_2$ | 107.92 |
| 9 | $Nb_2O_5$ | 62.96 |
| 10 | $SiO_2$ | 120.09 |
| 11 | $Nb_2O_5$ | 91.85 |
| 12 | $SiO_2$ | 26.16 |
| 13 | $Nb_2O_5$ | 7.35 |
| 14 | $SiO_2$ | 107.80 |
| 15 | $Nb_2O_5$ | 70.62 |
| 16 | $SiO_2$ | 38.46 |

The $Nb_2O_5$ layers in the filter stack vary in thickness from about 5 nm to about 100 nm and the $SiO_2$ layers from about 25 nm to about 125 nm in thickness. The layers may be applied by conventional thin film techniques such as chemical vapor deposition or sputtering.

Figure 4:
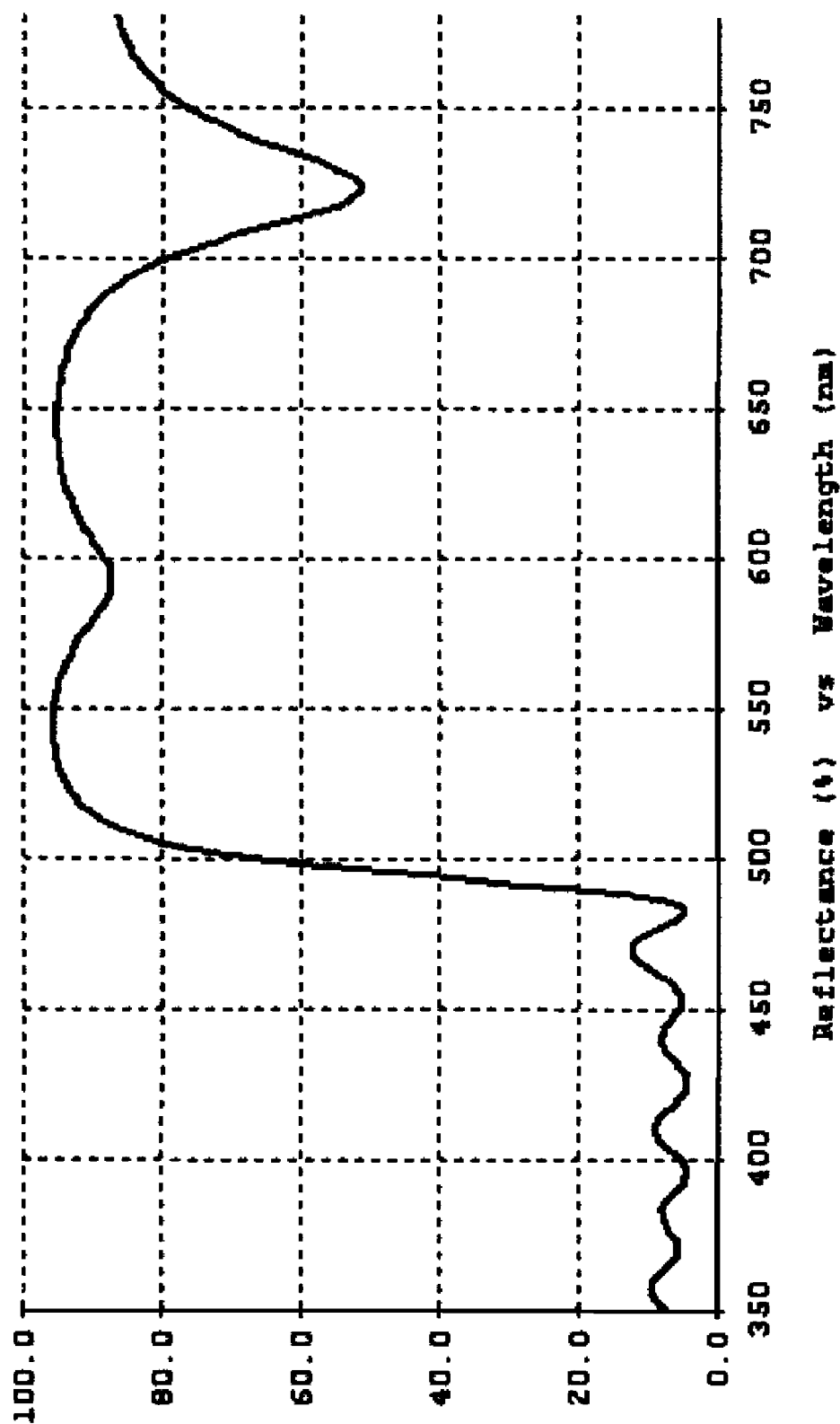
FIG. 4 is a graph of the calculated optical properties provided by a filter according to an aspect of the invention.

The optical filter 18 when formulated as shown in Table 1 and applied to a glass substrate or one side of a monolithic phosphor, will provide the properties shown in FIG. 4. As will be seen from FIG. 4, the optical filter 18 has high reflectance at the green to yellow region and high transmission at the blue region, below 495 nm.

There are several places in the pcLED where the thin film coating can be added in the package. The first design (FIG. 1) aims to reduce inward blue light and recycle inward yellow light. A transparent ("non scattering" may be more accurate, since it requires some absorption in blue region.) monolithic phosphor will replace the conventional powdered phosphor layer in the package. The advantage of using a transparent monolithic phosphor is that most of the blue emission from the LED die will transmit because there is no scattering due to the phosphor particle surfaces and it provides a substrate where the thin films can be coated. The transparent bulk phosphor can be YAG:Ce transparent monolithic polycrystalline ceramic or single crystal, or other high quantum efficiency transparent glass ceramics. Transparent glass ceramic is another candidate for the transparent monolithic phosphor. Transparent glass ceramics doped with rare earth ions which have comparable quantum efficiency to the commercial YAG:Ce phosphor are additional candidates for the monolithic phosphor. In the case of a polycrystalline YAG:Ce monolith, it is preferred that the concentration of the Ce activator is in the range of about 0.05 to about 0.5 atomic percent (at. % Ce) which is defined herein as the ratio of the number of Ce atoms to the total number of Ce and Y atoms, Ce/(Ce+Y). This number represents the number of cerium atoms that were substituted for yttrium atoms in the phosphor. Depending on the scattering coefficient, a preferred thickness of the ceramic monolith is about 100 µm.

In the design, shown in FIG. 1, the yellow emission can be recovered by deposition of a multi-layer thin film coating, such as that provided in Table 1, under the transparent bulk phosphor. The coating reflects most of the yellow emission from the phosphor outward. By reducing blue scattering and recovering the inward yellow emission, the light extraction efficiency will improve greatly. This configuration has the highest extraction efficiency in theory.

Figure 2:
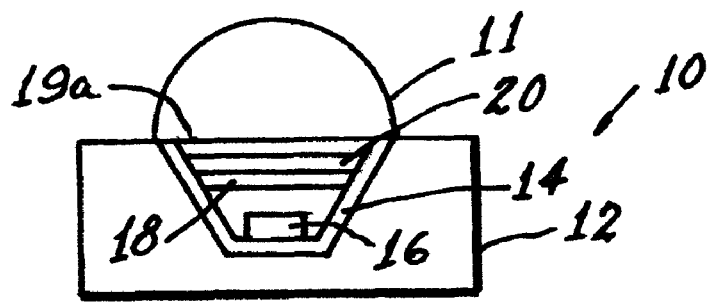
FIG. 2 is a diagrammatic view of an alternate embodiment of the invention.

In the second design, shown in FIG. 2, the state of the art YAG:Ce phosphor powder 19a is chosen as the light converting material. A filter is added to the package. The filter uses a thin quartz plate or other highly transparent glass plate as a substrate 20. The multi-layer thin film filter 18 is coated on the substrate to form a selective reflecting filter. The powdered phosphor mixed with encapsulant is then coated on the filter. Although in this design the scattering of blue light by the phosphor cannot be avoided, the inward yellow light can be recycled efficiently. The eye sensitivity function $V(\lambda)$ is very low at the blue region, as the yellow emission contributes the most luminous flux. Although only the yellow emission is recovered, the estimated luminous efficacy of this configuration is comparable to the configuration described above (and shown in FIG. 1).

Figure 3:
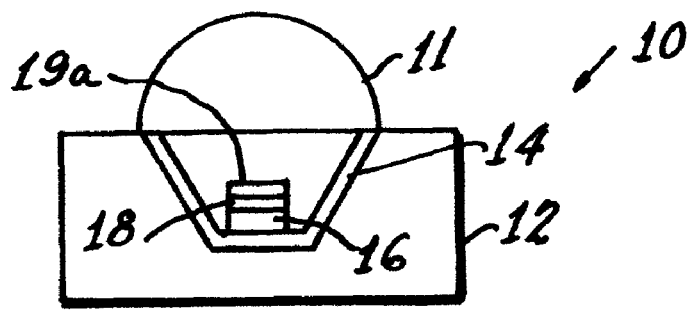
FIG. 3 is a diagrammatic view of yet another embodiment of the invention.

The third design, shown in FIG. 3, may be the most cost effective one. The multi-layer thin film filter 18 is deposited directly on the LED chip wafer before dicing. Then, the powdered phosphor is coated on top of the multi-layer thin film. After dicing, each LED die is ready for the package. This design requires little change in the current package process for white pcLED products; but, since the phosphor layer is right on the top of the die, the un-recovered light still has a greater chance of being absorbed by the LED die.

To test the results of the above-described procedures, a series of measurements were made on phosphor-coated and uncoated glass slides to see the effect of a blue-transmitting yellow-reflecting coating based on interference filter (IF) technology. Slides of B270 glass (in 1" diameter, about 1 mm in thickness) had been used as substrates for IF coatings of a dielectric stack type that collectively reflect light at wavelengths >510 nm and transmit blue and blue-green (blue additive filter, Cheshire Optical, Inc.). Both clear slides (no IF coating) and the slides with IF coating were covered with a thin layer of YAG:Ce phosphor ($Y_3Al_5O_{12}$:Ce). In order to minimize the possible impact of the phosphor coating procedure on the IF filters and speed up the optical testing, unbaked phosphor layers that still contained the polymer binder were used. The excitation of YAG:Ce occurs in the blue spectral range where the binder system is completely transparent and colorless. The standard composition of such slurry allows for a relatively even distribution of phosphor on the slide surface. Baking is needed for a complete removal of organic residue and also better binding properties.

A four-inch integrating sphere served as collection means for phosphor-scattered light. The slides were placed right at the 1"-opening of the sphere and held by self-centering lens holder. As a source for blue light, a regular medium-brightness encapsulated LED from Panasonic (LNG992CFBW: 30 mA, 3.5V, 1500 mcd T1-3/4) emitting at 460 nm was located about 0.9 inches away from the slide and the sphere input aperture. The spectra were detected and recorded by means of Ocean Optics USB2000 spectrometer, a fiber optic probe and corresponding software. The sphere and spectrometer have been spectrally calibrated for the system response and the correction curve obtained. Multiple phosphor loadings were used for varying the emission ratio of the blue LED and YAG:Ce phosphor by increasing or decreasing the solid content in the coating slurries. Although the slides were weighed before and after coating, the error introduced by the weighing procedure happened to be large in multiple cases. Upon repeating the procedure, reliable weighing indicated a freshly prepared set of slides (one clear and one with the IF filter) to have nearly equal coating weights of about 2.5 mg/cm$^2$. Despite the mentioned uncertainties, all IF-coated slides show significant enhancement of yellow light collected inside the sphere, compared to the clear ones. This effect is assigned to the IF filter. Table 2 demonstrates it qualitatively. In addition, a thin rectangular cover glass slide (thickness: 150 µm) was coated by a simple isopropanol-phosphor mixture and dried in air. This one slide, optically measured together with the IF-coated and uncoated glass slides yielded a similar result of nearly doubling the intensity at phosphor emission wavelengths for coupling with the IF filter. This effectively excludes any possibility of assigning enhanced forward emission to a higher powder weight on the IF-coated slides.

TABLE 2

Values of blue LED emission through slides with and without phosphor layer (~2.5 mg/cm$^2$) normalized to that of the clear slides in each case (integrated radiance, photons/sec)*. Corresponding difference measured in lumens has been indicated for the cumulative emission of blue + phosphor.

| Emission/Sample | | Clear, no phosphor | IF-coated, no phosphor | Clear, w/ phosphor | IF-coated, w/ phosphor |
|---|---|---|---|---|---|
| YAG:Ce (phot/sec) | | — | — | 1.00*$^a$ | 1.75 |
| Blue (phot/sec) | | 1.00 | 0.93 | 1.00*$^b$ | 0.84 |
| Total | phot/sec | 1.00 | 0.93 | 1.00*$^c$ | 1.49 |
| | lm | — | — | 1.00*$^d$ | 1.75 |

Figure 5:
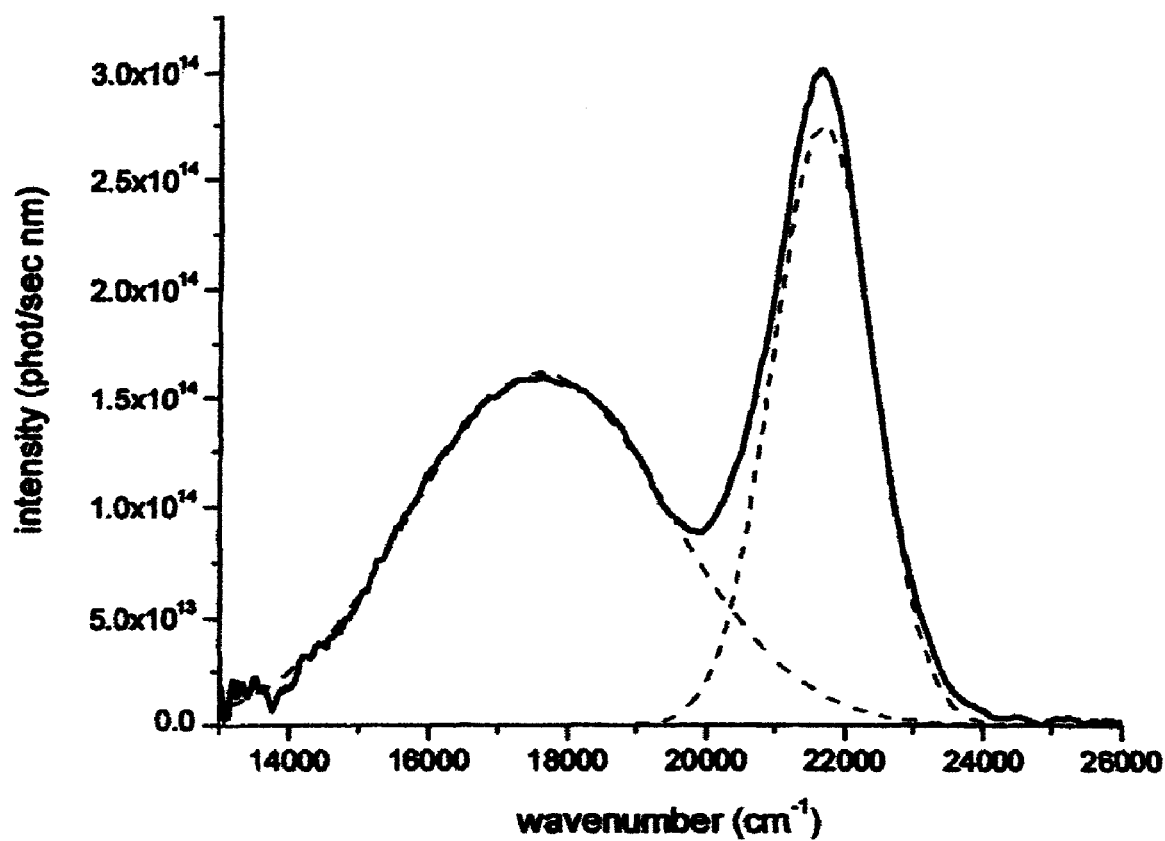
FIG. 5 is an emission spectrum decomposed to two Gaussian components of pure phosphor and LED emissions.

Table 2 presents the results of a detailed analysis of emission spectra. The spectra were corrected for the system response to yield relative values of irradiance (in photons/sec nm) and thereafter decomposed to two Gaussian components of pure phosphor and LED emissions (FIG. 5). Relative change in either component in presence of the IF coating has been indicated and the corresponding value in lumens calculated for the total emission in the case of phosphor-coated slides. For slides with no phosphor, one notices about −7% loss of transmitted blue light whereas for the phosphor coated ones this drop is much larger, amounting to −16%. The latter is actually an exaggeration due to modification of the LED spectrum by the IF-filter, with the result not being as close to a single Gaussian as before and therefore producing an inferior fit. It is evident that the phosphor component alone gains about 75% of the initial value in radiance with adding the IF coating. The corresponding increase in total radiance is smaller (at about 49%) due to losses of blue, whereas a 75% increase occurs in total lumens due to higher green and yellow emissions in forward direction from the phosphor.

The above experiment convincingly indicates the advantages of the reflector layer next to the phosphor coating. Visible emission in the forward direction is significantly increased.

While there have been shown and described what are present considered to be the preferred embodiments of the invention, it will be apparent to those skilled in the art that various changes and modifications can be made herein without departing from the scope of the invention as defined by the appended claims.

What is claimed is:

1. A light emitting diode comprising:
 a die emitting blue light of a first frequency;
 a phosphor energized by light of said first frequency to emit light of a second frequency; and
 a filter interposed between said phosphor and said die, said filter having a reflectance of less than about 15% at wavelengths from about 350 nm to about 480 nm and a reflectance of greater than about 80% at wavelengths from about 510 nm to about 700 nm, said filter being comprised of alternating layers of $Nb_2O_5$ and $SiO_2$, wherein the $Nb_2O_5$ layers vary in thickness from about 5 nm to about 100 nm and the $SiO_2$ layers vary in thickness from about 25 nm to about 125 nm.

2. The light emitting diode of claim 1 wherein said phosphor is a solid, monolithic YAG:Ce ceramic.

3. The light emitting diode of claim 2 wherein said filter is affixed to said ceramic monolith.

4. The light emitting diode of claim 2 wherein the concentration of Ce in the YAG:Ce ceramic is from about 0.05 at. % Ce to about 0.5 at. % Ce.

5. The light emitting diode of claim 2 wherein the YAG:Ce ceramic has a thickness of about 100 μm.

6. The light emitting diode of claim 1 wherein said phosphor is powdered and applied to a first side of a transparent substrate and said filter is applied to the opposite side of said substrate.

7. The light emitting diode of claim 1 wherein said filter is applied to said die and said phosphor is applied to said filter.

8. The light emitting diode of claim 1 wherein there are eight layers of $Nb_2O_5$ and eight layers of $SiO_2$.

9. The light emitting diode of claim 1 wherein said phosphor is a single crystal YAG:Ce phosphor.

10. The light emitting diode of claim 1 wherein the filer has 16 alternating layers having the following thicknesses:

| Layer | Material | Thickness (nm) |
|---|---|---|
| 1 | $Nb_2O_5$ | 69.94 |
| 2 | $SiO_2$ | 106.99 |
| 3 | $Nb_2O_5$ | 59.34 |
| 4 | $SiO_2$ | 124.57 |
| 5 | $Nb_2O_5$ | 27.16 |
| 6 | $SiO_2$ | 125.14 |
| 7 | $Nb_2O_5$ | 57.10 |
| 8 | $SiO_2$ | 107.92 |
| 9 | $Nb_2O_5$ | 62.96 |
| 10 | $SiO_2$ | 120.09 |
| 11 | $Nb_2O_5$ | 91.85 |
| 12 | $SiO_2$ | 26.16 |
| 13 | $Nb_2O_5$ | 7.35 |
| 14 | $SiO_2$ | 107.80 |
| 15 | $Nb_2O_5$ | 70.62 |
| 16 | $SiO_2$ | 38.46 |

11. The light emitting diode of claim 10 wherein said filter is applied to said die am said phosphor is applied to said filter.

12. The light emitting diode of claim 11 wherein said phosphor is a solid, monolithic YAG:Ce ceramic.

13. The light emitting diode of claim 10 wherein said phosphor is a solid, monolithic YAG:Ce ceramic.

* * * * *